(12) United States Patent
Chen et al.

(10) Patent No.: US 11,758,109 B2
(45) Date of Patent: Sep. 12, 2023

(54) TECHNIQUES FOR MEASURING DEPTH AND POLARIZATION FROM A SINGLE SENSOR

(71) Applicant: OMNIVISION TECHNOLOGIES, INC., Santa Clara, CA (US)

(72) Inventors: Wenshou Chen, Santa Clara, CA (US); Yiyi Ren, San Jose, CA (US); Guansong Liu, San Jose, CA (US); Badri Padmanabhan, San Jose, CA (US); Alireza Bonakdar, San Jose, CA (US); Richard Mann, Santa Clara, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 234 days.

(21) Appl. No.: 17/164,679

(22) Filed: Feb. 1, 2021

(65) Prior Publication Data

US 2022/0247992 A1 Aug. 4, 2022

(51) Int. Cl.
*H04N 13/218* (2018.01)
*G06T 7/593* (2017.01)
*H04N 23/55* (2023.01)
*H04N 13/00* (2018.01)

(52) U.S. Cl.
CPC ........... *H04N 13/218* (2018.05); *G06T 7/593* (2017.01); *H04N 23/55* (2023.01); *G06T 2207/10012* (2013.01); *H04N 2013/0081* (2013.01)

(58) Field of Classification Search
CPC ......... H04N 2013/0081; H04N 5/2254; H04N 13/218; G06T 2207/10012; G06T 7/593
See application file for complete search history.

(56) References Cited

U.S. PATENT DOCUMENTS

| | | |
|---|---|---|
| 5,890,095 A | 3/1999 | Barbour et al. |
| 2015/0256733 A1* | 9/2015 | Kanamori ............... G01N 21/21 348/234 |
| 2020/0103511 A1* | 4/2020 | Jin .......................... G01S 17/42 |

* cited by examiner

*Primary Examiner* — On S Mung
(74) *Attorney, Agent, or Firm* — CHRISTENSEN O'CONNOR JOHNSON KINDNESS PLLC (57) ABSTRACT

In some embodiments, an image sensor is provided. The image sensor comprises a plurality of photodiodes arranged as a photodiode array. The photodiodes of the photodiode array are arranged into a first quadrant, a second quadrant, a third quadrant, and a fourth quadrant. A first polarization filter and a first telecentric lens are aligned with the first quadrant. A second polarization filter and a second telecentric lens are aligned with the second quadrant. A third polarization filter and a third telecentric lens are aligned with the third quadrant. A fourth telecentric lens is aligned with the fourth quadrant.

20 Claims, 8 Drawing Sheets

TECHNIQUES FOR MEASURING DEPTH AND POLARIZATION FROM A SINGLE SENSOR

BACKGROUND INFORMATION

Field of the Disclosure

This disclosure relates generally to image sensors, and in particular but not exclusively, relates to CMOS image sensors and applications thereof.

Background Information

Image sensors have become ubiquitous and are now widely used in digital cameras, cellular phones, security cameras, as well as medical, automobile, and other applications. As image sensors are integrated into a broader range of electronic devices it is desirable to enhance their functionality, performance metrics, and the like in as many ways as possible (e.g., resolution, power consumption, dynamic range, etc.) through both device architecture design as well as image acquisition processing.

The typical image sensor operates in response to image light reflected from an external scene being incident upon the image sensor. The image sensor includes an array of pixels having photosensitive elements (e.g., photodiodes) that absorb a portion of the incident image light and generate image charge upon absorption of the image light. The image charge of each of the pixels may be measured as an output voltage of each photosensitive element that varies as a function of the incident image light. In other words, the amount of image charge generated is proportional to the intensity of the image light, which is utilized to produce a digital image (i.e., image data) representing the external scene.

BRIEF DESCRIPTION OF THE SEVERAL VIEWS OF THE DRAWINGS

Non-limiting and non-exhaustive embodiments of the present invention are described with reference to the following figures, wherein like reference numerals refer to like parts throughout the various views unless otherwise specified. To easily identify the discussion of any particular element or act, the most significant digit or digits in a reference number refer to the figure number in which that element is first introduced.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

Embodiments of an apparatus, system, and method each including or otherwise related to an image sensor capable of generating three-dimensional shape and depth images are described herein. In the following description numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one example" or "one embodiment" means that a particular feature, structure, or characteristic described in connection with the example is included in at least one example of the present invention. Thus, the appearances of the phrases "in one example" or "in one embodiment" in various places throughout this specification are not necessarily all referring to the same example and embodiment. Furthermore, the particular features, structures, or characteristics may be combined in any suitable manner in one or more examples and embodiments.

Throughout this specification, several terms of art are used. These terms are to take on their ordinary meaning in the art from which they come, unless specifically defined herein or the context of their use would clearly suggest otherwise.

Embodiments described herein utilize an image sensor that includes photodiodes configured to collect polarization information and photodiodes configured to collect depth information, in order to generate three-dimensional shape and depth images. In some embodiments, the photodiodes configured to collect polarization information are aligned with a polarization grid in order to generate information that can be used to determine a set of ambiguous surface normals. In some embodiments, the photodiodes may be arranged into groups that share a common telecentric lens, and pairs of groups may be treated as a stereo camera system in order to collect depth information. In some embodiments, additional or other structures, such as phase detection photodiodes or time-of-flight sensors, may be included to collect depth information. In some embodiments, the depth information may be used to solve the ambiguities in the ambiguous surface normals, thereby creating the three-dimensional shape and depth image.

Combining depth detection photodiodes and polarization detection photodiodes in a single image sensor provides multiple technical benefits, including but not limited to the elimination of registration errors between depth information and polarization information captured by separate image sensors, and the simplification of a device that includes the single combined image sensor instead of a separate depth sensor and polarization sensor.

The use of telecentric lenses to focus incident light on the image sensor also provides multiple technical benefits over previous solutions. The use of a polarization grid may reduce quantum efficiency by more than 50%. A near-infrared enhancement layer such as Nyxel can improve quantum efficiency, but at the cost of a reduced extinction ratio and increased cross-talk. A back-side illumination (BSI) sensor with $SiO_2$ deep trench isolation structures may be used to decrease crosstalk and improve quantum efficiency, but the extinction ratio will still be poor. Metal deep trench isolation structures may be used with back-side illumination sensors to address these issues, but at a much greater expense. As discussed in more detail below, telecentric lenses produce a set of co-parallel chief rays which are all perpendicular to the image plane, thereby removing cross-talk and increasing the extinction ratio.

FIG. 1-FIG. 6 illustrate representative views of various non-limiting example embodiments of portions of image sensors according to various aspects of the present disclosure. It is appreciated that the views presented in FIG. 1-FIG. 6 may omit certain elements of image sensor to avoid obscuring details of the disclosure. It is further appreciated that in some embodiments, image sensor may not necessarily include all elements illustrated in FIG. 1-FIG. 6.

Figure 1:
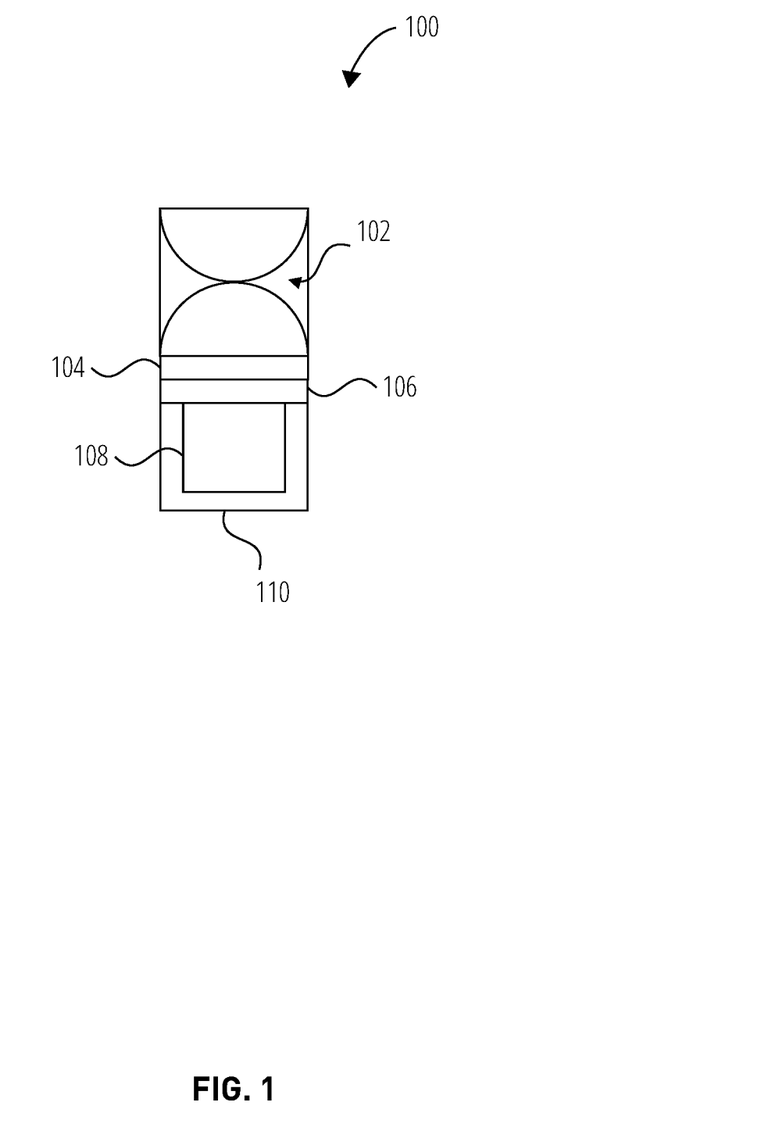
FIG. 1 illustrates a non-limiting example embodiment of a cross-sectional view of a single sensor element, according to various aspects of the present disclosure.

FIG. 1 illustrates a non-limiting example embodiment of a cross-sectional view of a single sensor element 100, according to various aspects of the present disclosure. More specifically, the cross-sectional view of FIG. 1 is a representative view taken of a single cell of a photodiode array such as those illustrated in FIG. 2 to FIG. 6.

As shown, the sensor element 100 includes a semiconductor material 110, a photodiode 108, a polarization layer 106, a 104, and a telecentric lenses 102. The photodiode 108 may be disposed within the semiconductor material 110. In some embodiments, individual photodiodes 108 within a photodiode array may correspond to doped regions within the respective portions of the semiconductor material 110 that are collectively responsive to incident light (e.g., the doped regions may form a PN junction that generates electrical or image charge proportional to a magnitude or intensity of the incident light).

In the illustrated embodiment, the portion of semiconductor material 110 within a sensor element 100 may be arranged such that the respective portion of semiconductor material 110 has a first lateral area that is greater than the lateral area of the photodiode 108. For example, the illustrated photodiode 108 is formed within respective portion of semiconductor material 110, but notably does not laterally extend across the entirety of the respective portion of semiconductor material 110. Thus, it is appreciated that individual photodiodes included in the plurality of photodiodes of a photodiode array do not necessarily extend laterally across the entire cross-sectional area of the respective portions of semiconductor material 110. Rather, portions of semiconductor material 110 disposed between adjacent photodiodes may be utilized to form additional structures within the semiconductor material (e.g., isolation trenches, floating diffusion, and the like). In other embodiments, the respective portions of the semiconductor material 110 and the associated first lateral area corresponds to a largest lateral area of individual photodiodes included in the plurality of photodiodes in a photodiode array. In other words, in some embodiments the first lateral area corresponds to an area of the photodiode 108.

In the illustrated embodiment, the sensor element 100 further includes a color filter 104 optically aligned with the photodiode 108. A plurality of color filters 104 provided in a photodiode array may include N color filters that each have a specific spectral photoresponse to filter incident light propagating through an individual one of the plurality of color filters to a group of the plurality of photodiodes. For example, a blue color filter is optically aligned with photodiodes 108 in sensor elements labeled with a "B" in FIG. 2 to FIG. 4, a red color filter is optically aligned with photodiodes 108 in sensor elements labeled with a "R" in FIG. 2 to FIG. 4, and a green color filter is optically aligned with photodiodes 108 in sensor elements labeled with a G in FIG. 2 to FIG. 4, such that the image charge generated in response to incident light by the corresponding photodiodes 108 is substantially proportional to the intensity or magnitude of the corresponding component within the spectrum of light associated with the color filter incident upon the photodiodes 108. It is appreciated that plurality of color filters 104 is not limited to the described spectral photoresponses, and that other types of color filters may be included in photodiode arrays, including but not limited to color filters for a spectrum substantially equivalent to any one of, or a combination of, red, green, blue, panchromatic (i.e., clear or white), yellow, cyan, magenta, or other colors. In some embodiments, the color filter array may consequently be utilized to generate image signals representative of the incident light within at least the visible spectrum to generate an image representative of an external scene.

In the illustrated embodiment, the sensor element 100 also includes a polarization layer 106. The polarization layer 106 may be a polymer film, a wire grid, or any other suitable material that allows incident light 708 of a given polarization direction to pass through while attenuating incident light 708 of other polarization directions. In some embodiments, a photodiode array may include polarization layers 106 of at least three different directions separated by about 45 degrees in order to collect polarization information that can be used to derive ambiguous surface normals. In some embodiments, a polymer film polarization layer 106 or a wire grid polarization layer 106 may be formed in a single piece that covers multiple photodiodes 108 intended to sense the same polarization direction for a photodiode array.

In the illustrated embodiment, the sensor element 100 also includes a telecentric lenses 102. As illustrated, the telecentric lenses 102 is a double plano-convex lens, but any other telecentric flat lens may be used. In some embodiments (such as the photodiode arrays illustrated in FIG. 2 to FIG. 4), the telecentric lenses 102 covers a plurality of sensor elements 100 of the photodiode array, but is illustrated in FIG. 1 in association with a single sensor element 100 to show its cross-sectional position with respect to the other components of the sensor element 100. The telecentric lenses 102 produces a set of co-parallel chief rays which are all perpendicular to the image plane. This helps to remove cross-talk between adjacent sensor elements 100 of the photodiode array, and thus increases the extinction ratio. Further, the reduction of cross-talk enables the use of non-isolated structures, such as front-side illumination (FSI) sensors, back-side illumination (BSI) sensors without deep-trench isolation structures, or BSI sensors with partial deep-trench isolation structures. The telecentric lenses 102 also reduces illumination non-uniformity from the center of the photodiode array to the edge of the photodiode array, also known as vignetting reduction. Further, the telecentric lenses 102 eliminates the need for microlens shifting, because angular cross-talk between adjacent photodiodes 108 is reduced.

It is appreciated that sensor element 100 may be fabricated by semiconductor device processing and microfabrication techniques known by one of ordinary skill in the art. In one embodiment, fabrication of sensor element 100 may include providing a semiconductor material (e.g., a silicon wafer having a front side and a back side), forming a mask or template (e.g., out of cured photo resist) on the front side of the semiconductor material 110 via photolithography to provide a plurality of exposed regions of the front side of semiconductor material 110, doping (e.g., via ion implantation, chemical vapor deposition, physical vapor deposition, and the like) the exposed portions of the semiconductor material 110 to form the photodiode 108 that extends into semiconductor material 110 from the front side of semiconductor material 110, removing the mask or template (e.g., by dissolving the cured photoresist with a solvent), and planarizing (e.g., via chemical mechanical planarization or polishing) the front side of semiconductor material 110. In the same or another embodiment, photolithography may be similarly used to form the color filter 104 (e.g., cured pigmented polymers having a desired spectral photoresponse), the polarization layer 106 (e.g., polymer based films of a desired polarization behavior), and the telecentric lenses 102 (e.g., polymer based lenses having a target shape and size formed from a master mold or template). It is appreciated that the described techniques are merely demonstrative and not exhaustive and that other techniques may be utilized to fabricate one or more components of method 800.

FIG. 2 to FIG. 6 are schematic drawings that illustrate top-down views of various layouts of pluralities of sensor elements that make up photodiode arrays of image sensors according to various aspects of the present disclosure.

Figure 2:
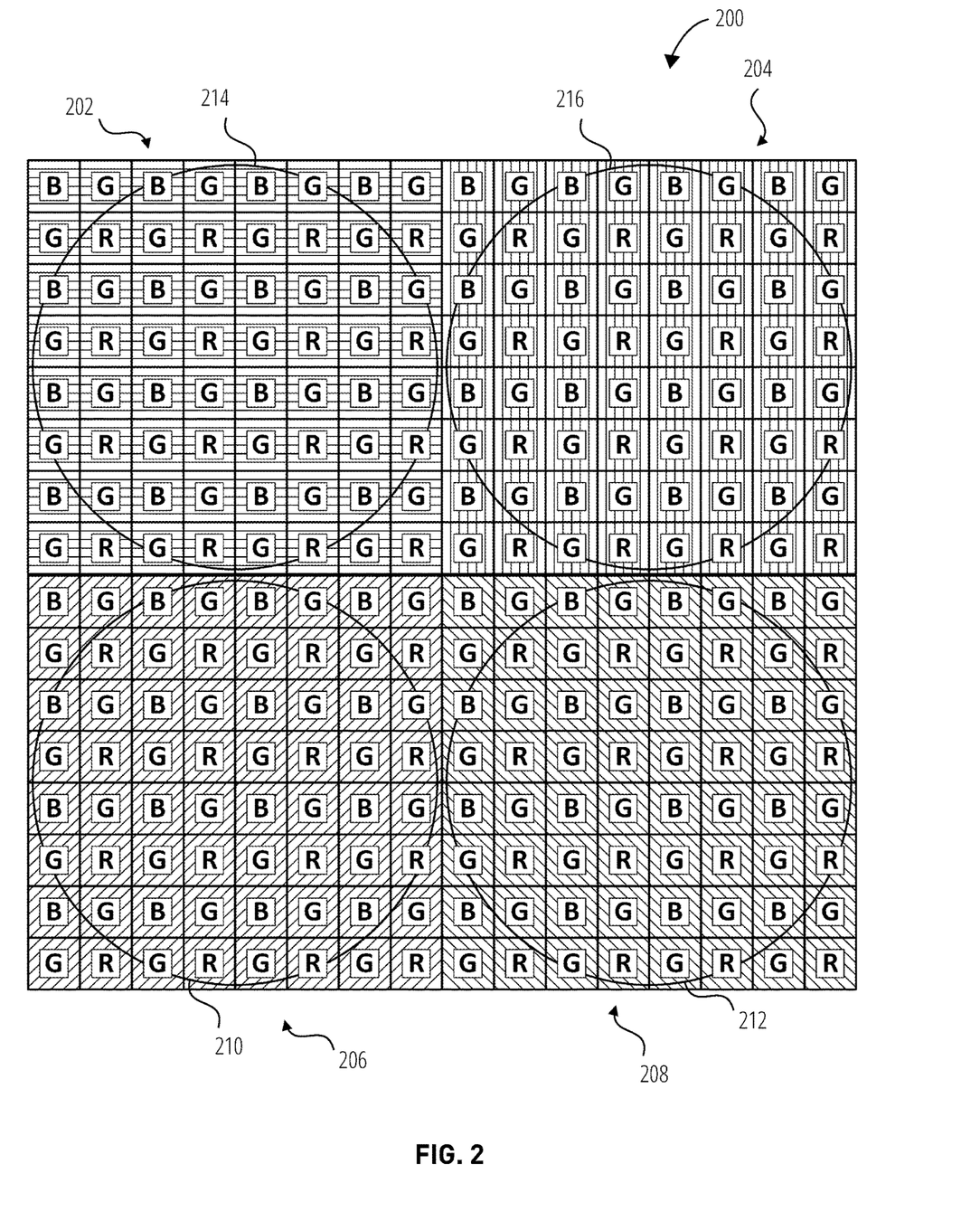
FIG. 2 to FIG. 6 are schematic drawings that illustrate top-down views of various layouts of pluralities of sensor elements that make up photodiode arrays of image sensors according to various aspects of the present disclosure.

In FIG. 2, a photodiode array 200 is made up of a plurality of 256 sensor elements arranged in a first quadrant 202, a second quadrant 204, a third quadrant 206, and a fourth quadrant 208. Each of the sensor elements is associated with a red, green, or blue color filter 104, as indicated by the letter "R," "G," or "B," respectively. By using the red, green, and blue color filters 104, signals produced by the plurality of sensor elements can be used for generating two-dimensional color image information.

Each quadrant is also associated with a polarization layer 106 of a different polarization direction. For example, the first quadrant 202 may be associated with a polarization layer 106 at 0 degrees, the second quadrant 204 may be associated with a polarization layer 106 at 90 degrees, the third quadrant 206 may be associated with a polarization layer 106 at 45 degrees, and the fourth quadrant 208 may be associated with a polarization layer 106 at 135 degrees. The polarization layer 106 may be a wire grid polarizer, a polymer film, or any other suitable type of polarization layer 106.

As shown, the first quadrant 202 is associated with a first telecentric lens 214, the second quadrant 204 is associated with a second telecentric lens 216, the third quadrant 206 is associated with a third telecentric lens 210, and the fourth quadrant 208 is associated with a fourth telecentric lens 212. Though the telecentric lenses in the illustration are shown as circles that do not fully cover all of the sensor elements of each quadrant, in some embodiments, each of the telecentric lenses is shaped to cover all of the sensor elements in its associated quadrant.

By using the polarization layers 106 having four different polarities, signals produced by the photodiode array 200 may be used to generate ambiguous surface normals for shape imaging. Meanwhile, signals from each pair of quadrants may be used as a stereo camera system in order to obtain depth information that can be used to disambiguate the ambiguous surface normals, as discussed below.

Figure 3:
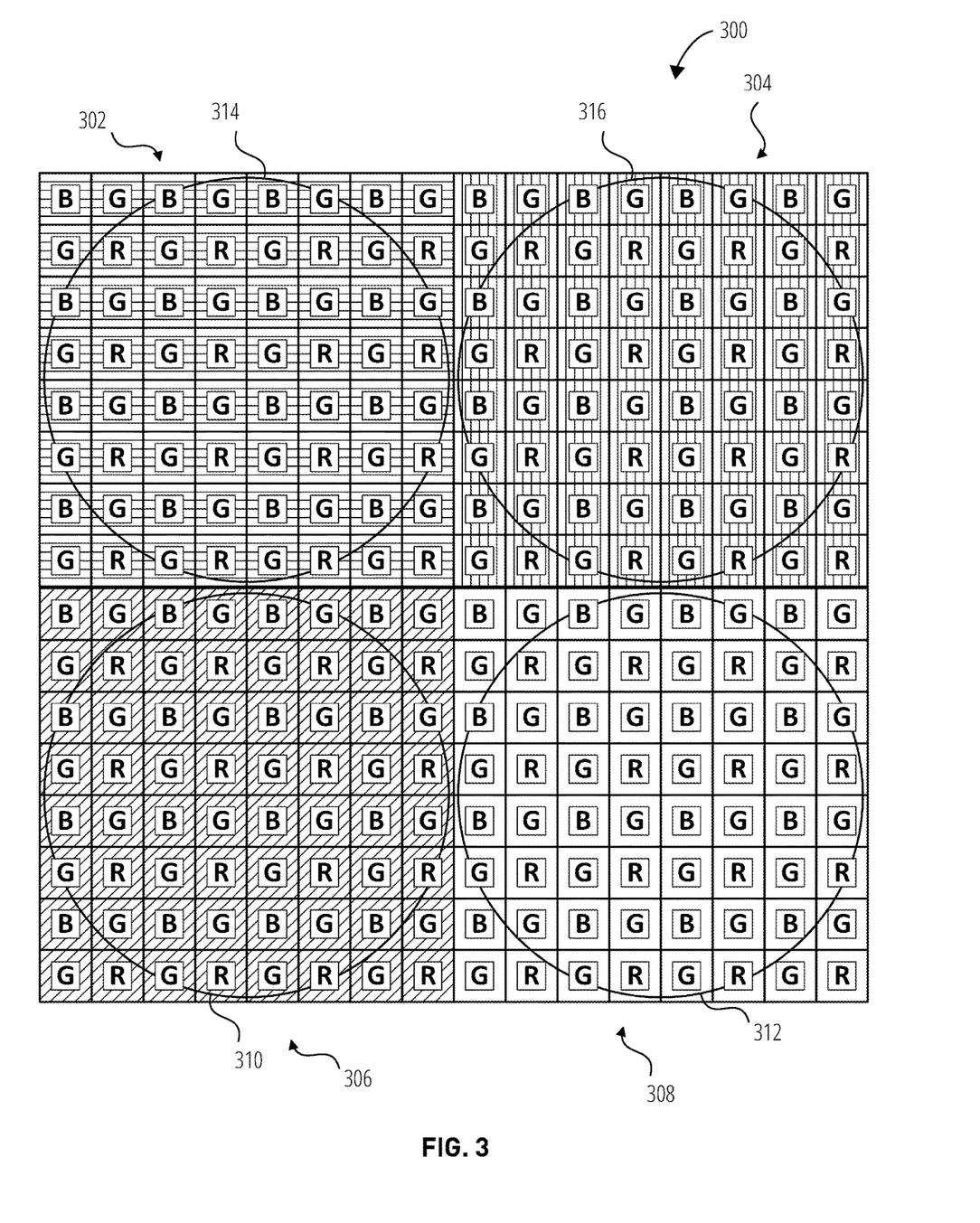

In FIG. 3, a photodiode array 300 is again made up of a plurality of 256 sensor elements arranged in a first quadrant 302, a second quadrant 304, a third quadrant 306, and a fourth quadrant 308. Again, each of the sensor elements is associated with a red, green, or blue color filter 104, and signals from the plurality of sensor elements can be used for two-dimensional color imaging. Also, the first quadrant 302 is associated with a first telecentric lens 314, the second quadrant 304 is associated with a second telecentric lens 316, the third quadrant 306 is associated with a third telecentric lens 310, and the fourth quadrant 308 is associated with a fourth telecentric lens 312.

In FIG. 3, the first quadrant 302, second quadrant 304, and third quadrant 306 are associated with polarization layers 106 in three different polarization directions. For example, the first quadrant 302 may be associated with a polarization layer 106 at 0 degrees, the second quadrant 304 may be associated with a polarization layer 106 at 90 degrees, and the third quadrant 306 may be associated with a polarization layer 106 at 45 degrees. The fourth quadrant 308 may then be used for normal two-dimensional color imaging. As in FIG. 2, signals from each pair of quadrants may be used as a stereo camera system in order to obtain depth information that can be used to disambiguate ambiguous surface normals generated based on signals from the first quadrant 302, the second quadrant 304, and the third quadrant 306.

Figure 4:
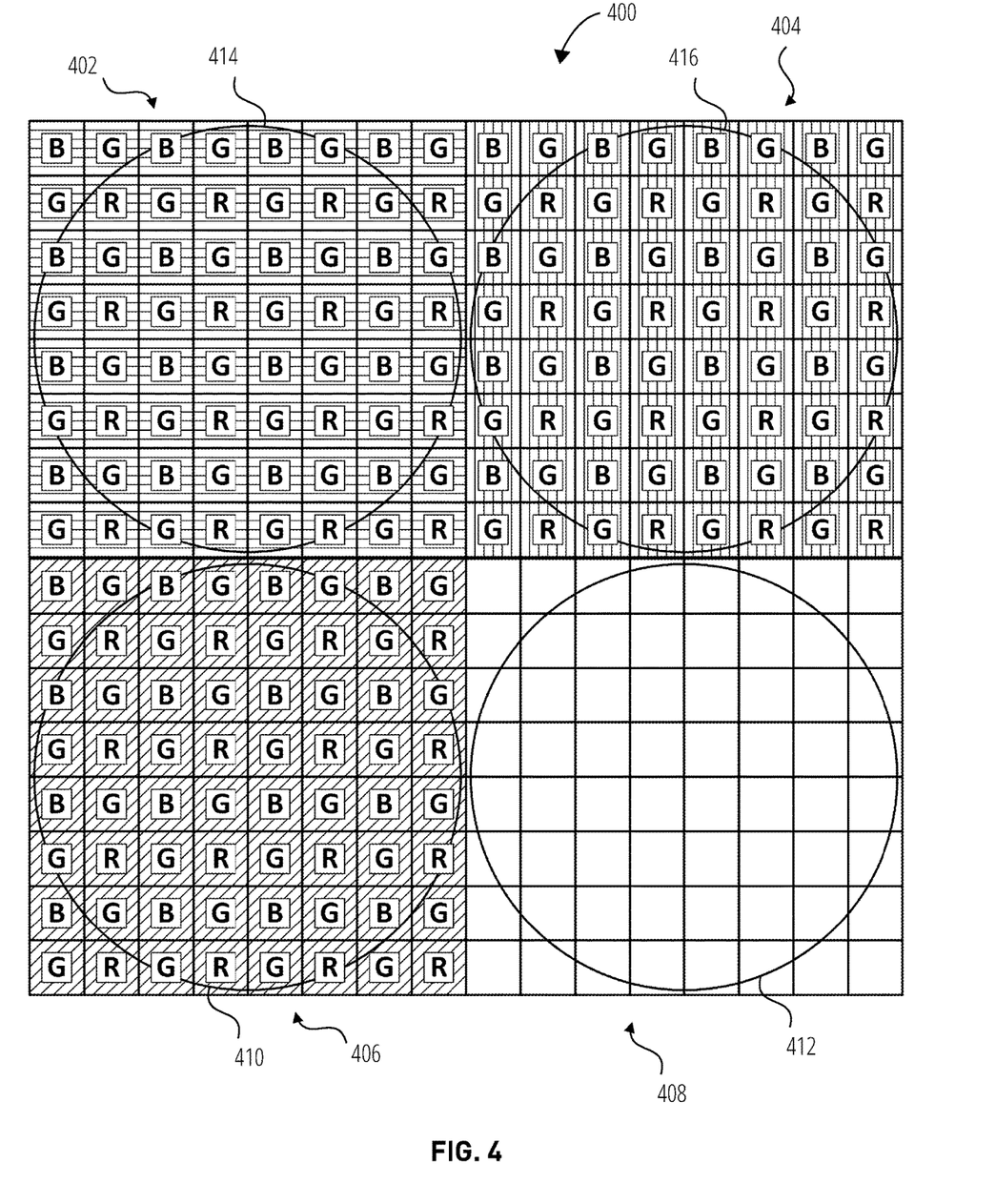

FIG. 4 is similar to FIG. 3, at least in that in the photodiode array 400, the 256 sensor elements are grouped in a first quadrant 402, a second quadrant 404, a third quadrant 406, and a fourth quadrant 408, with sensor elements in the first quadrant 402 being associated with a first telecentric lens 414, sensor elements in the second quadrant 404 being associated with a second telecentric lens 416, sensor elements in the third quadrant 406 being associated with a third telecentric lens 410, and sensor elements in the fourth quadrant 408 being associated with a fourth telecentric lens 412. Likewise, the first quadrant 402, second quadrant 404, and third quadrant 406 are associated with a polarization layer 106, while the fourth quadrant 408 is missing a polarization layer 106.

The primary difference between the photodiode array 300 and the photodiode array 400 is that while the sensor elements of the first quadrant 402, second quadrant 404, and third quadrant 406 are associated with either a red, green, or blue color filter 104, the sensor elements of the fourth quadrant 408 are not associated with a color filter 104. As such, sensor elements of the first quadrant 402, second quadrant 404, and third quadrant 406 may be used for generating ambiguous surface normal information and two-dimensional color image information, while the sensor elements of the fourth quadrant 408 may be used for generating two-dimensional monochrome color information. As with FIG. 2 and FIG. 3, any pair of quadrants of FIG. 4 may be treated as a stereo camera system for determining depth information.

Figure 5:
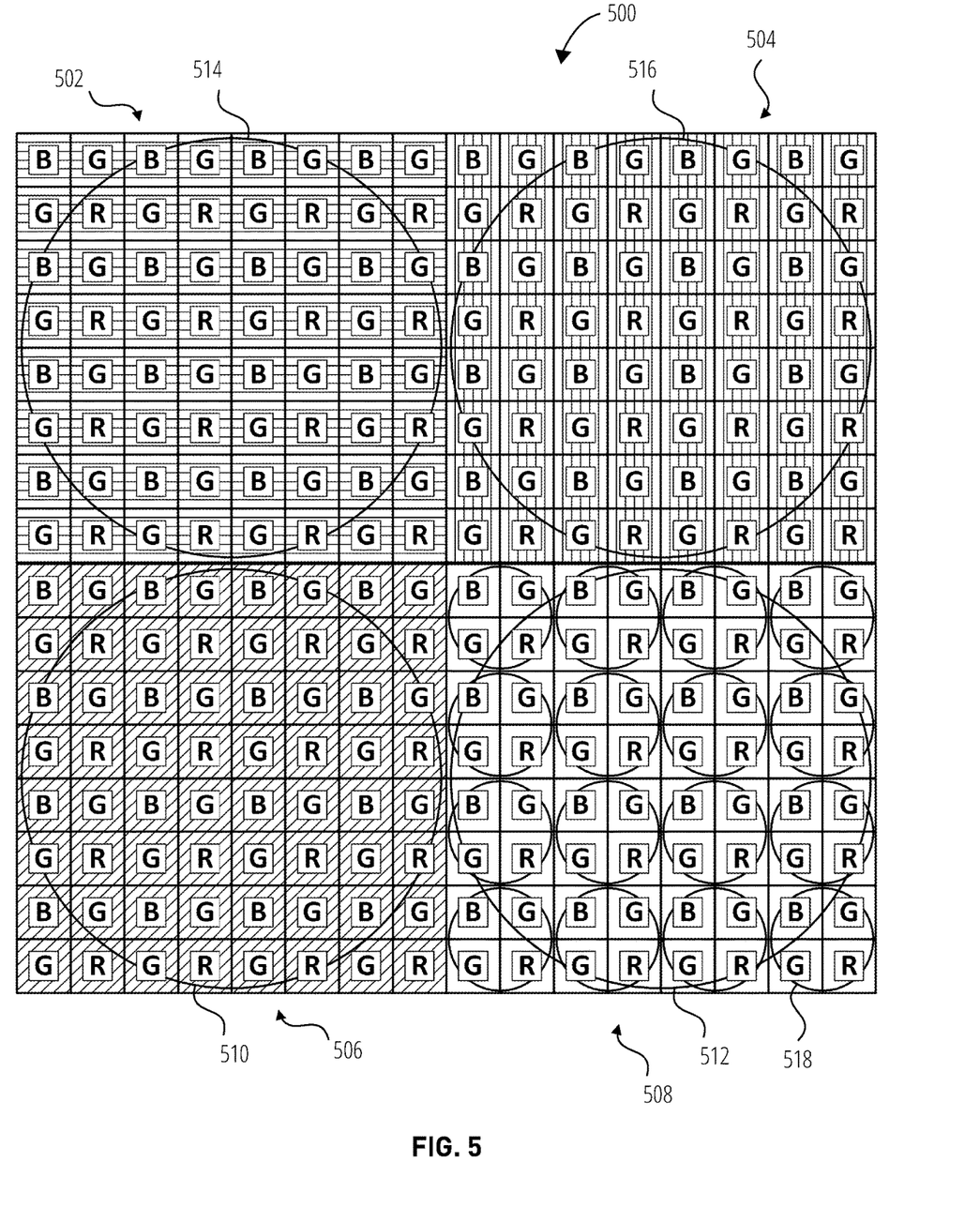

Using the photodiode array 500 illustrated in FIG. 5, different or additional techniques for determining depth information may be used. As with the other embodiments illustrated above, the sensor elements of the photodiode array 500 are arranged in a first quadrant 502, a second quadrant 504, a third quadrant 506, and a fourth quadrant 508. Likewise, the first quadrant 502 is associated with a first telecentric lens 514, the second quadrant 504 is associated with a second telecentric lens 516, the third quadrant 506 is associated with a third telecentric lens 510, and the fourth quadrant 508 is associated with a fourth telecentric lens 512. Also, the first quadrant 502 is associated with a polarization layer 106 in a first polarization direction, the second quadrant 504 is associated with a polarization layer 106 in a second polarization direction, and the third quadrant 506 is associated with a polarization layer 106 in a third polarization direction. Further, each of the sensor elements of the photodiode array 500 is associated with a color filter 104.

Unlike the photodiode array 200, photodiode array 300, and photodiode array 400, the fourth quadrant 508 of the photodiode array 500 includes a plurality of microlenses, including microlens 518. The plurality of microlenses is arranged as a microlens array optically aligned with the sensor elements of the fourth quadrant 508 of the photodiode array 500. Each of the microlenses may be formed of a polymer (e.g., polymethylmethacrylate, polydimethylsiloxane, etc.) or other material and be shaped to have optical power for converging, diverging, or otherwise directing light incident upon the plurality of microlenses through a corresponding optically aligned one of the plurality of color filters 104 to a respective group of photodiodes 108 included in the plurality of sensor elements. As illustrated, individual microlenses included in the plurality of microlenses may have a lateral area that is greater than lateral areas of individual photodiodes 108 included in the plurality of photodiodes 108. Each microlens in the fourth quadrant 508 is optically aligned with a group of four photodiodes 108. By comparing signals received by each photodiode 108 in the groups of four photodiodes 108, the groups of four photodiodes 108 can be used for phase detection, and depth information can be obtained therefrom. One non-limiting example of a technique for using microlenses for phase detection and to generate depth information is described in commonly owned U.S. patent application Ser. No. 16/729,088, filed Dec. 27, 2019, the entire disclosure of which is hereby incorporated by reference herein for all purposes.

Figure 6:
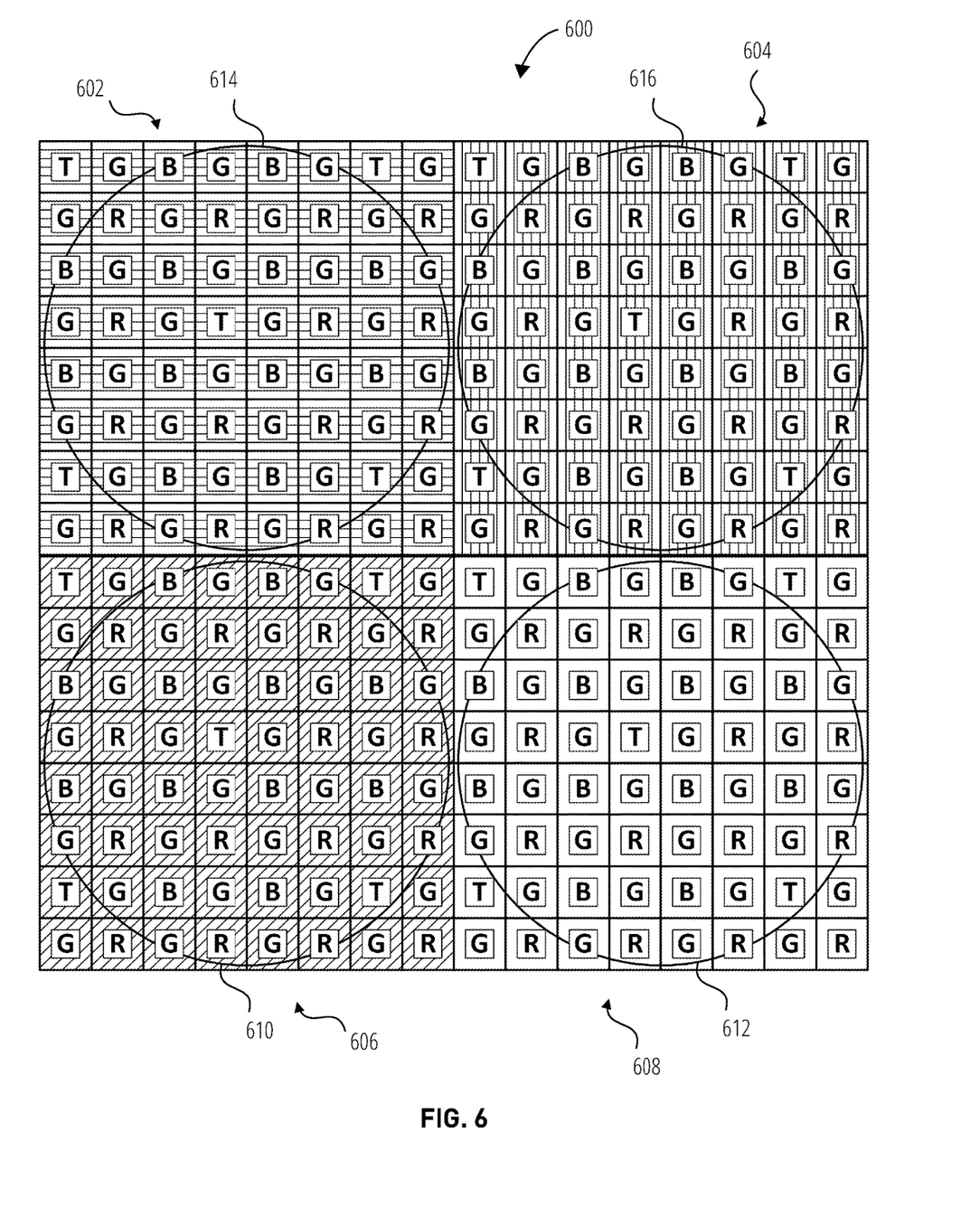

FIG. 6 illustrates another non-limiting example embodiment of a layout for a photodiode array 600 that provides another different or additional technique for determining depth information. Again, the sensor elements of the photodiode array 600 are arranged in a first quadrant 602, a second quadrant 604, a third quadrant 606, and a fourth quadrant 608, with a corresponding first telecentric lens 14, second telecentric lens 616, third telecentric lens 610, and fourth telecentric lens 612. The first quadrant 602, second quadrant 604, and third quadrant 606 are also associated with a first polarization layer 106, a second polarization layer 106, and a third polarization layer 106 in different polarization directions. The fourth quadrant 608 is not associated with a polarization layer 106. Also, most of the sensor elements are associated with red, green, or blue color filters 104 as indicated by the "R," "G," and "B" letters.

Unlike the photodiode array 200, photodiode array 300, photodiode array 400, and photodiode array 500, the photodiode array 600 includes a plurality of time-of-flight sensors interleaved within the plurality of sensor elements. Locations of the time-of-flight sensors are indicated by the letter "T" in the photodiode array 600. Depth information may be generated using signals generated by the plurality of time-of-flight sensors.

Figure 7:
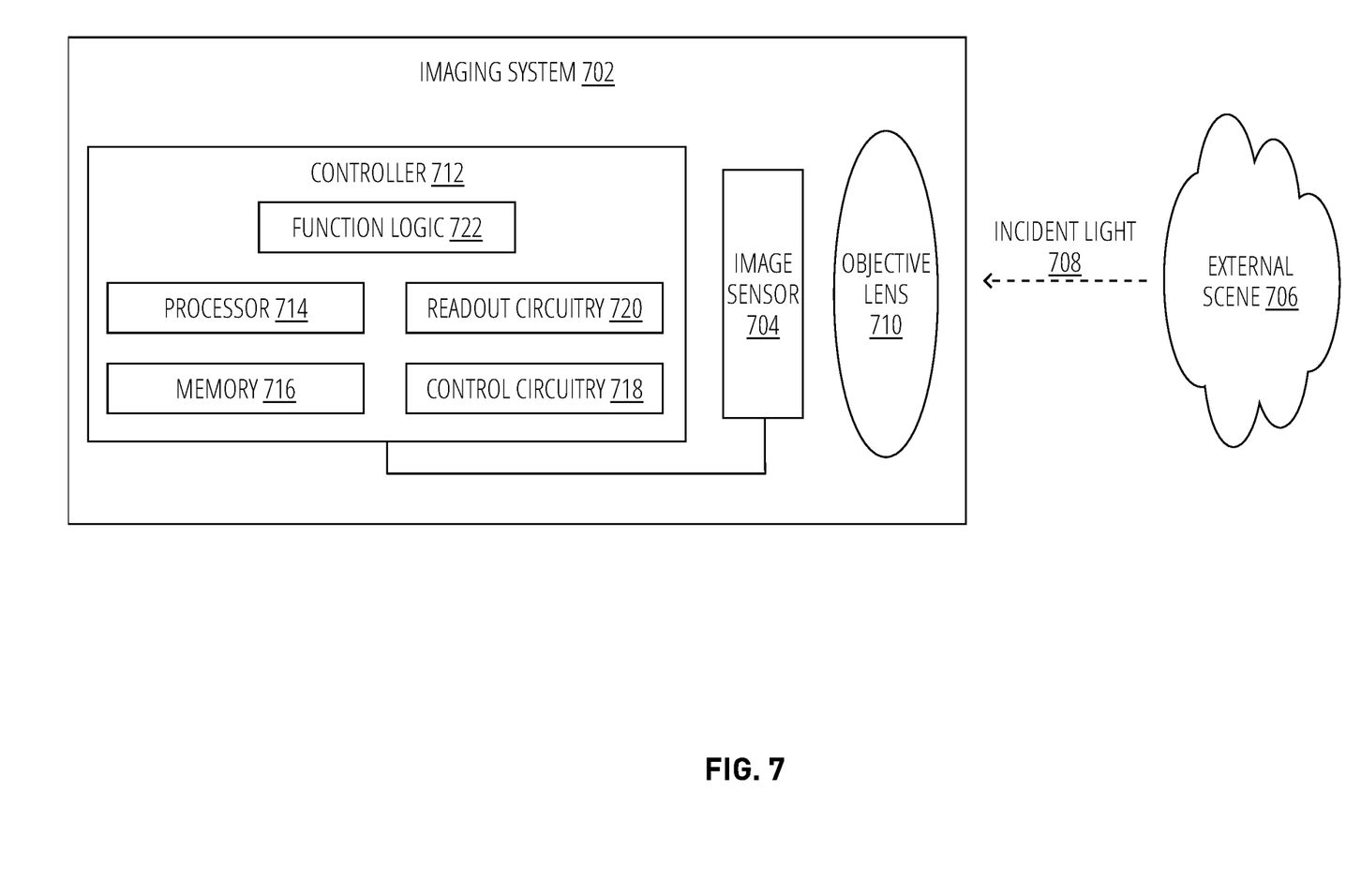
FIG. 7 is a functional block diagram of a non-limiting example embodiment of an imaging system including an image sensor according to various aspects of the present disclosure.

FIG. 7 is a functional block diagram of a non-limiting example embodiment of an imaging system 702 including an image sensor 704 according to various aspects of the present disclosure. Imaging system 702 is capable of generating a shape image representing an external scene 706 based on incident light 708 received by the image sensor 704. Imaging system 702 includes image sensor 704 to generate electrical or image signals in response to incident light 708, objective lens 710 to focus incident light 708 on the image sensor 704, and controller 712 to control, inter alia, operation of image sensor 704. Image sensor 704 is one possible implementation of an image sensor as illustrated in any of FIG. 2-FIG. 6. The controller 712 includes one or more processors 714, a memory 716, control circuitry 718, readout circuitry 720, and function logic 722.

The controller 712 includes logic and/or circuitry to control the operation (e.g., during pre-, post-, and in situ phases of image and/or video acquisition) of the various components of imaging system 702. The controller 712 may be implemented as hardware logic (e.g., application specific integrated circuits, field programmable gate arrays, system-on-chip, etc.), software/firmware logic executed on a general purpose microcontroller or microprocessor, or a combination of both hardware and software/firmware logic. In some embodiments, the controller 712 includes the processor 714 coupled to memory 716 that stores instructions for execution by the controller 712 or otherwise by one or more components of the imaging system 702. The instructions, when executed by the controller 712, may cause the imaging system 702 to perform operations that may be associated with the various functional modules, logic blocks, or circuitry of the imaging system 702 including any one of, or a combination of, the control circuitry 718, the readout circuitry 720, the function logic 722, image sensor 704, objective lens 710, and any other element of imaging system 702 (illustrated or otherwise). The memory is a non-transitory computer-readable medium that may include, without limitation, a volatile (e.g., RAM) or non-volatile (e.g., ROM) storage system readable by controller 712. It is further appreciated that the controller 712 may be a monolithic integrated circuit, one or more discrete interconnected electrical components, or a combination thereof. Additionally, in some embodiments the one or more electrical components may be coupled to one another to collectively function as the controller 712 for orchestrating operation of the imaging system 702.

Control circuitry 718 may control operational characteristics of the image sensor 704 (e.g., exposure duration, when to capture digital images or videos, and the like). Readout circuitry 720 reads or otherwise samples the analog signal from the individual sensor elements (e.g., read out electrical signals generated by each of the plurality of photodiodes of the image sensor 704 in response to incident light to generate polarization information signals, a phase detection depth information signal, a time-of-flight depth information signal, read out image signals to capture an image frame, and the like) and may include amplification circuitry, analog-to-digital (ADC) circuitry, image buffers, or otherwise. In the illustrated embodiment, readout circuitry 720 is included in controller 712, but in other embodiments readout circuitry 720 may be separate from the controller 712. Function logic 722 is coupled to the readout circuitry 720 to receive the electrical signals to generate an image in response to receiving image signals or data, determine ambiguous surface normals based on polarization information and disambiguate the surface normals using depth information to generate a three-dimensional shape image, and so on. In some embodiments, the electrical or image signals may be respectively stored as three-dimensional shape data and/or image data and may be manipulated by the function logic 722 (e.g., demosaic the image data, apply post image effects such as crop, rotate, remove red eye, adjust brightness, adjust contrast, or otherwise).

Figure 8:
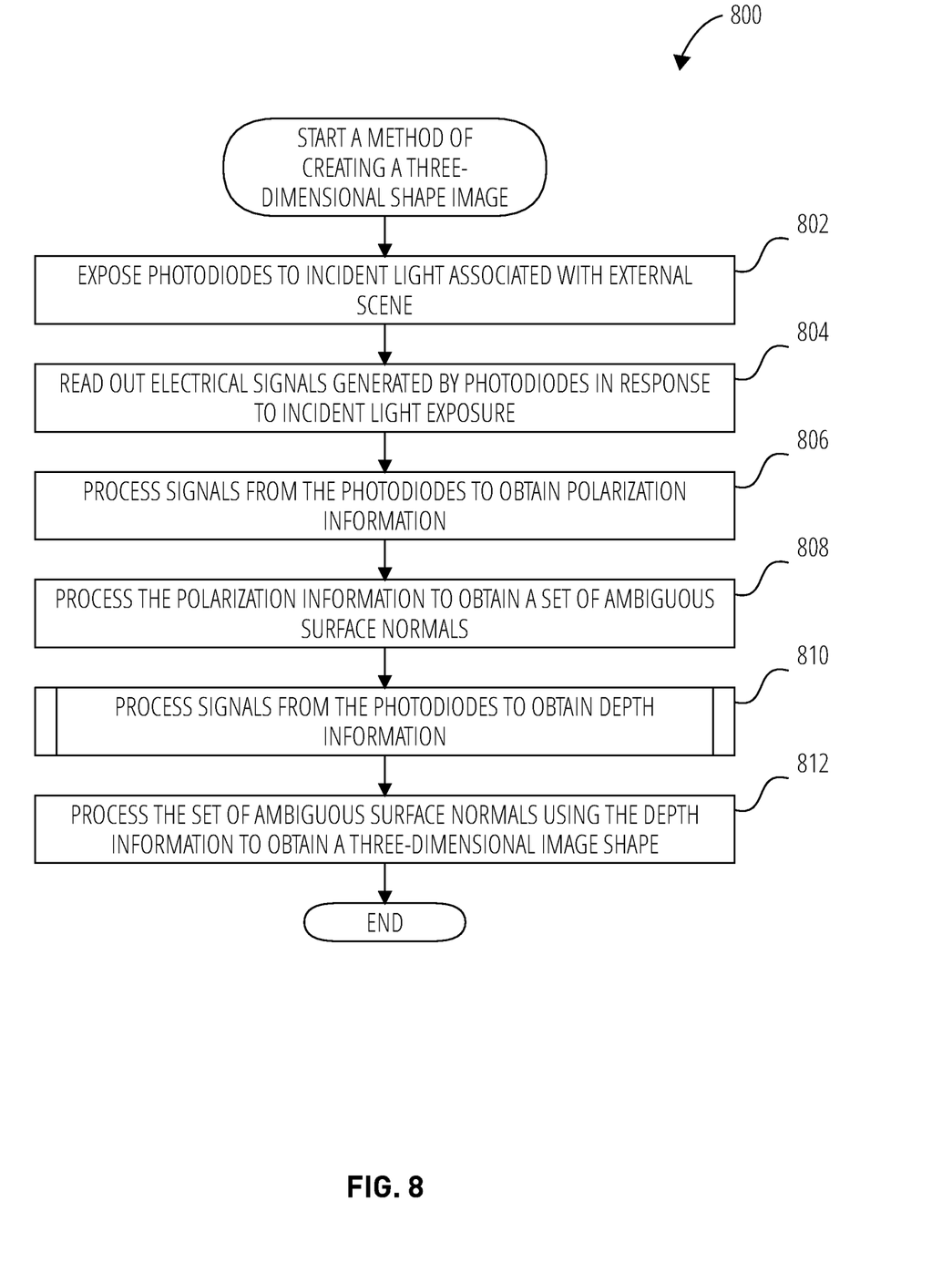
FIG. 8 is a flowchart that illustrates a non-limiting example embodiment of a method of creating a three-dimensional shape image according to various aspects of the present disclosure.

FIG. 8 is a flowchart that illustrates a non-limiting example embodiment of a method of creating a three-dimensional shape image according to various aspects of the present disclosure.

From a start block, the method 800 proceeds to block 802, where control circuitry 718 of a controller 712 causes photodiodes 108 of an image sensor 704 to be exposed to incident light 708 associated with an external scene 706. The photodiodes 108 may be any of the types of photodiodes 108 and/or sensor elements illustrated and described above.

At block 804, readout circuitry 720 of the controller 712 reads out electrical signals generated by photodiodes 108 of the image sensor 704 in response to the incident light 708 exposure. Electrical signals may be read out individually from respective sensor elements (e.g., by transferring the image charge generated in each of the photodiodes 108 as an electrical signal one row at a time to column storage capacitors, and then reading out the elements individually using a column decoder coupled to a multiplexer) in response to the incident light 708.

At block 806, function logic 722 of the controller 712 processes the signals from the photodiodes 108 to obtain polarization information, and at block 808, the function logic 722 processes the polarization information to obtain a set of ambiguous surface normals. Any suitable technique may be used to obtain the ambiguous surface normals from the electrical signals read out from each quadrant of the image sensor 704 that is associated with a polarization layer 106 of a given polarization direction. For example, the intensity at a given image point, for a given polarizer angle $\phi_{pol}$, may be given as:

$$I(\phi_{pol}) = \frac{I_{max} + I_{min}}{2} + \frac{I_{max} - I_{min}}{2} \cos(2(\phi_{pol} - \varphi))$$

wherein the three unknown variables in this equation are $I_{max}$, $I_{min}$, and the azimuth angle ($\varphi$). It can be seen that the azimuth angle is ambiguous, because an azimuth angle of $\varphi$ and $\varphi+\pi$ return the same value for the above equation. As another example, the azimuth angle may be determined from the Stokes vector derived from four samples from corresponding sensor elements associated with four different polarization layers 106 as follows:

$$S_0 = \text{Intensity} = I_{tot}$$
$$S_0 = I_{0^*} + I_{90^*}$$
$$S_1 = I_{0^*} - I_{90^*}$$
$$S_2 = I_{45^*} - I_{135^*}$$
$$DoLP = \rho = \frac{\sqrt{S_1^2 + S_2^2}}{S_0}, DoLP \in [0, 1]$$
$$AoLP = \frac{1}{2}\arctan\left(\frac{S_2}{S_1}\right), AoLP \in [0°, 180°]$$

The degree of linear polarization (DoLP) may be used to obtain the zenith angle of the surface normal as follows:

$$\rho = \frac{\left(n - \frac{1}{n}\right)^2 \sin^2\theta}{2 + 2n^2 - \left(n + \frac{1}{n}\right)^2 \sin^2\theta + 4\cos\theta\sqrt{n^2 - \sin^2\theta}}$$

where $\theta$ is the zenith angle, and n is the refractive index.

The angle of linear polarization (AoLP) may be used to obtain the ambiguous azimuth angle as follows:

$$\psi = \frac{1}{2}\begin{cases} \arctan\left(\frac{S_2}{S_1}\right) + \frac{\pi}{2}, & S_1 \geq 0 \\ \arctan\left(\frac{S_2}{S_1}\right) + \pi, & S_1 > 0 \text{ and } S_2 < S_1 \\ \arctan\left(\frac{S_2}{S_1}\right) + 0, & S_1 > 0 \text{ and } S_2 \geq S_1 \end{cases}$$

Ambiguous Azimuth Angle = $\psi$ + (0 or $\pi$)

Different techniques may be used for varying materials. For example, the above techniques may be used for imaging dielectric surfaces, while other techniques may be used for non-dielectric surfaces such as mirrors or metals.

At subroutine block 810, the controller 712 processes signals from the photodiodes 108 to obtain depth information. The technique to be used to obtain the depth information may depend on the type of image sensor 704 used. For example, for image sensors 704 such as the photodiode array 200 illustrated in FIG. 2, the photodiode array 300 illustrated in FIG. 3, or the photodiode array 400 illustrated in FIG. 4, the controller 712 uses pairs of quadrants as a stereo camera system. A stereo matching technique may be used to find pixel correspondence between the pixels, and depth information may be extracted from the corresponding pixels using any suitable stereo imagery technique. As another example, for an image sensor 704 such as the photodiode array 500 illustrated in FIG. 5, phase detection may be performed for the sensor elements that share a common microlens, and depth information may be generated based on the detected phase information. As yet another example, for an image sensor 704 such as the photodiode array 600 illustrated in FIG. 6, depth information may be generated directly based on signals received from the time-of-flight sensors.

At block 812, the function logic 722 processes the set of ambiguous surface normals using the depth information to obtain a three-dimensional shape image. Any suitable technique may be used to disambiguate the ambiguous azimuth angles using the depth information. For example, in some embodiments, techniques are used to generate a separate set of surface normals based on the depth information. An operator $\mathscr{A}$ may then be found that relates the normals based on the polarization information and the normals based on the depth information, such that the variation between the two sets of normals can be minimized as a total variation minimization problem. Once the operator $\mathscr{A}$ is obtained, it can be applied to disambiguate the polarization normals and thereby obtain the three-dimensional shape image.

The method 800 then proceeds to an end block and terminates.

While the preferred embodiment of the invention has been illustrated and described, it will be appreciated that various changes can be made therein without departing from the spirit and scope of the invention. Thus, the above description of illustrated examples of the present invention, including what is described in the Abstract, are not intended to be exhaustive or to be a limitation to the precise forms disclosed. While specific embodiments of, and examples for, the invention are described herein for illustrative purposes, various equivalent modifications are possible without departing from the broader spirit and scope of the present invention. Indeed, it is appreciated that the specific example voltages, currents, frequencies, power range values, times, etc., are provided for explanation purposes and that other values may also be employed in other embodiments and examples in accordance with the teachings of the present invention.

These modifications can be made to examples of the invention in light of the above detailed description. The terms used in the following claims should not be construed to limit the invention to the specific embodiments disclosed in the specification and the claims. Rather, the scope is to be determined entirely by the following claims, which are to be construed in accordance with established doctrines of claim interpretation. The present specification and figures are accordingly to be regarded as illustrative rather than restrictive.

What is claimed is:

1. An image sensor, comprising:
a plurality of photodiodes arranged as a photodiode array, wherein the photodiodes of the photodiode array are arranged into a first quadrant, a second quadrant, a third quadrant, and a fourth quadrant;
a first polarization filter and a first telecentric lens aligned with the first quadrant;
a second polarization filter and a second telecentric lens aligned with the second quadrant;
a third polarization filter and a third telecentric lens aligned with the third quadrant; and
a fourth telecentric lens aligned with the fourth quadrant.

2. The image sensor of claim 1, further comprising computing circuitry configured to:
process signals from at least the photodiodes of the first quadrant, the photodiodes of the second quadrant, and the photodiodes of the third quadrant to obtain polarization information;
process the polarization information to obtain a set of ambiguous surface normals;
process signals from the plurality of photodiodes to obtain depth information; and
process the set of ambiguous surface normals using the depth information to obtain a three-dimensional image shape.

3. The image sensor of claim 2, wherein processing the signals from the plurality of photodiodes to obtain the depth information includes processing signals from at least one pair of the quadrants of the photodiode array as a stereo camera system.

4. The image sensor of claim 2, wherein the plurality of photodiodes includes a plurality of time-of-flight photodiodes, and wherein processing the signals from the plurality of photodiodes to obtain the depth information includes processing the signals from the plurality of time-of-flight photodiodes to obtain the depth information.

5. The image sensor of claim 2, further comprising a plurality of microlenses arranged over groups of photodiodes of the fourth quadrant, and wherein processing the signals from the plurality of photodiodes to obtain the depth information includes comparing electrical signals between photodiodes that have a common corresponding microlens.

6. The image sensor of claim 2, wherein the computing circuitry is further configured to:
process signals from the photodiodes of the fourth quadrant to obtain a two-dimensional image.

7. The image sensor of claim 1, wherein at least one of the first polarization filter, the second polarization filter, and the third polarization filter is a polymer film.

8. The image sensor of claim 1, wherein at least one of the first polarization filter, the second polarization filter, and the third polarization filter is a wire grid.

9. The image sensor of claim 1, further comprising a fourth polarization filter aligned with the fourth quadrant.

10. The image sensor of claim 1, wherein the plurality of photodiodes includes a plurality of non-isolated image sensors.

11. The image sensor of claim 10, wherein the plurality of non-isolated image sensors includes front-side illumination photodiodes.

12. The image sensor of claim 10, wherein the plurality of non-isolated image sensors includes back-side illumination photodiodes without deep trench isolation structures.

13. The image sensor of claim 10, wherein the plurality of non-isolated image sensors includes back-side illumination photodiodes with partial deep trench isolation structures.

14. The image sensor of claim 1, wherein at least one of the first telecentric lens, the second telecentric lens, and the third telecentric lens is a double plano-convex lens.

15. The image sensor of claim 1, wherein polarization angles of the first polarization filter, the second polarization filter, and the third polarization filter are separated by 45 degrees.

16. A controller comprising computing circuitry configured to:
receive signals from a plurality of photodiodes of a photodiode array of an image sensor, wherein the photodiodes of the photodiode array are arranged in a first quadrant associated with a first polarization filter and a first set of photodiodes from the plurality of photodiodes, a second quadrant associated with a second polarization filter and a second set of photodiodes from the plurality of photodiodes, a third quadrant associated with a third polarization filter and a third set of photodiodes from the plurality of photodiodes, and a fourth quadrant associated with a fourth set of photodiodes from the plurality of photodiodes;
process the signals from the photodiodes of the first quadrant, the second quadrant, and the third quadrant to obtain polarization information;
process the polarization information to obtain a set of ambiguous surface normals;
process signals from the plurality of photodiodes to obtain depth information; and
process the set of ambiguous surface normals using the depth information to obtain a three-dimensional image shape.

17. The controller of claim 16, wherein processing the signals from the plurality of photodiodes to obtain the depth information includes processing signals from at least one pair of quadrants of the photodiode array as a stereo camera system.

18. The controller of claim 16, wherein the plurality of photodiodes includes a plurality of time-of-flight photodiodes, and wherein processing the signals from the plurality of photodiodes to obtain the depth information includes processing the signals from the plurality of time-of-flight photodiodes to obtain the depth information.

19. The controller of claim 16, wherein the image sensor comprises a plurality of microlenses arranged over groups of photodiodes of the fourth quadrant, and wherein processing the signals from the plurality of photodiodes to obtain the depth information includes comparing electrical signals between photodiodes that have a common corresponding microlens.

20. The controller of claim 16, wherein the computing circuitry is further configured to:

process signals from the photodiodes of the fourth quadrant to obtain a two-dimensional image.

\* \* \* \* \*